United States Patent [19]

Meignant

[11] Patent Number: 5,031,006
[45] Date of Patent: Jul. 9, 1991

[54] SEMICONDUCTOR DEVICE HAVING A SCHOTTKY DECOUPLING DIODE

[75] Inventor: Didier S. Meignant, Emerainville, France

[73] Assignee: U.S. Philips Corp., New York, N.Y.

[21] Appl. No.: 453,239

[22] Filed: Dec. 13, 1989

Related U.S. Application Data

[63] Continuation of Ser. No. 246,895, Sep. 16, 1988, abandoned, which is a continuation of Ser. No. 872,055, Jun. 6, 1986, abandoned.

[30] Foreign Application Priority Data

Jun. 7, 1985 [FR] France .................... 85 08633

[51] Int. Cl.[5] ................ H01L 29/48; H01L 29/92; H01L 27/02
[52] U.S. Cl. ...................... 357/15; 357/14; 357/41; 357/47; 357/51
[58] Field of Search ............. 357/22 J, 22 I, 22 K, 357/22 G, 15, 22 R, 14, 51, 41, 23.2, 47; 307/457, 458, 499, 502, 544, 563, 317 A, 320

[56] References Cited

U.S. PATENT DOCUMENTS

| 3,699,362 | 10/1972 | Jordan ............................ 307/563 |
| 3,995,301 | 11/1976 | Magdo ............................ 357/15 |
| 4,160,984 | 7/1979 | Ladd, Jr. et al. ............... 357/22 I |
| 4,322,758 | 3/1982 | Ohya et al. ..................... 360/31 |
| 4,336,549 | 6/1982 | Ladd, Jr. ........................ 357/15 |
| 4,373,166 | 2/1983 | Bergeron et al. ............... 357/15 |
| 4,536,664 | 8/1985 | Martin ............................ 307/544 |
| 4,621,205 | 11/1986 | Miller ............................. 307/320 |
| 4,745,445 | 5/1988 | Mun et al. ....................... 357/15 |
| 4,811,065 | 3/1989 | Cogan ............................. 357/15 |

FOREIGN PATENT DOCUMENTS

| 0162541 | 11/1985 | European Pat. Off. .......... 357/22 |
| 0204387 | 12/1986 | European Pat. Off. .......... 357/22 |
| 57-02799 | 8/1982 | Japan .............................. 357/22 |
| 58-51577 | 3/1983 | Japan .............................. 357/22 |
| 58-131775 | 8/1983 | Japan .............................. 357/22 |
| 58-210666 | 12/1983 | Japan .............................. 357/15 |
| 59-35480 | 2/1984 | Japan .............................. 357/22 |
| 59-112645 | 6/1984 | Japan .............................. 357/15 |

OTHER PUBLICATIONS

Sato et al., "Chip-Type Planar Schottky Barrier Diodes Made from Selectively Grown GaAs", Electronics and Communication in Japan, vol. 55-C, No. 10, Oct. 1972.
Statz, "Fabricating Field Effect Transistors", IBM Technical Disclosure Bulletin, vol. 11, No. 4, Sep. 1968.

Primary Examiner—Andrew J. James
Assistant Examiner—Ngan Van Ngo
Attorney, Agent, or Firm—Steven R. Biren

[57] ABSTRACT

A semiconductor device includes at least one field effect transistor integrated monolithically on a substrate with a decoupling diode between a d.c. supply conductor and a ground conductor. The transistor is preferably a MESFET formed in a first semiconductor layer of the n-type preferably made of a III-V material. According to the invention, the decoupling diode is constituted by the ground conductor forming a Schottky junction of large surface area polarized in the opposite sense with a second semiconductor layer of the n-type, the supply conductor being resistively connected to the second semiconductor layer. According to a preferred embodiment, the second layer also comprises the resistive load of the transistor.

10 Claims, 2 Drawing Sheets

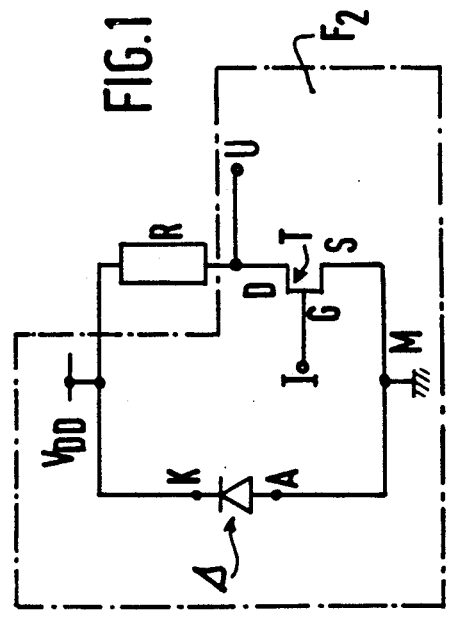
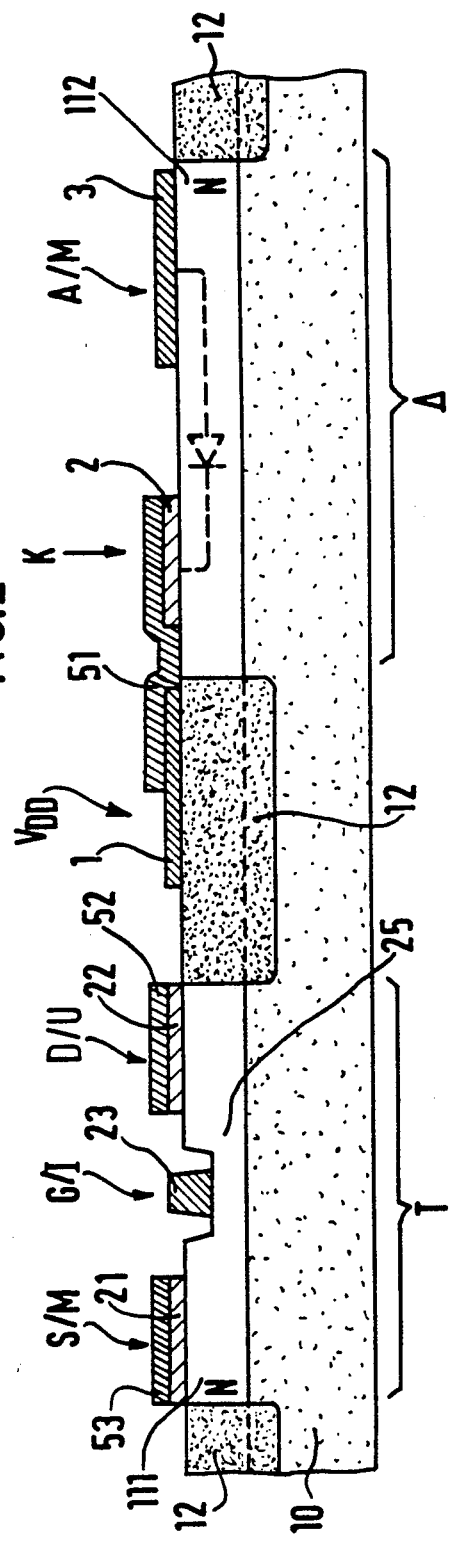

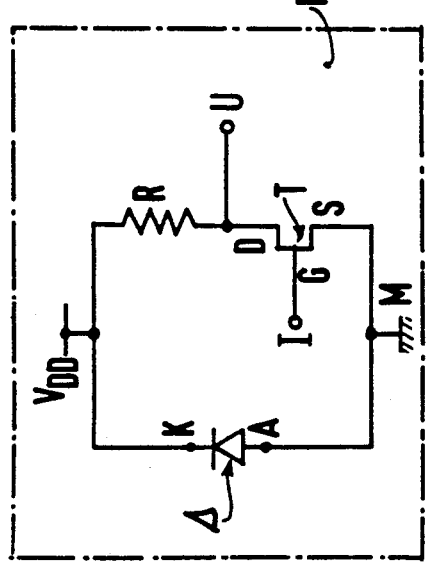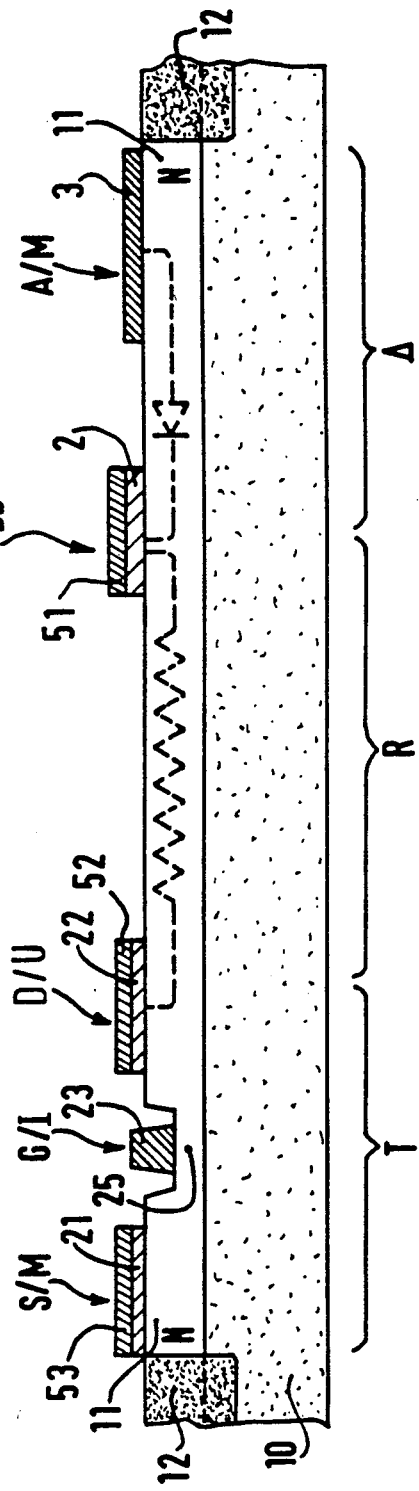

SEMICONDUCTOR DEVICE HAVING A SCHOTTKY DECOUPLING DIODE

This is a continuation of application Ser. No. 246,895, filed Sept. 16, 1988, which was a continuation of application Ser. No. 872,055, filed June 6, 1986, both now abandoned.

BACKGROUND OF THE INVENTION

The invention relates to a semiconductor device having at least one field effect transistor integrated monolithically on a substrate with a diode, this transistor having ohmic source and drain contacts provided on a first n-type semiconductor layer formed at the surface of the substrate, while a gate electrode forming a rectifying junction with said first semiconductor layer is arranged between the source and drain contacts, said diode having a Schottky contact provided on a second n-type semiconductor layer also formed at the surface of the substrate.

The invention is used in the manufacture of the decoupling capacitances arranged between the d.c. supply and ground, for example in integrated circuits of gallium arsenide.

A Schottky diode forming a capacitive element integrated monolithically with a field effect transistor of gallium arsenide is known from the prior art, i.e. from published Japanese Patent Application 59-112 645 (A) of 1984. This application describes a diode formed by a first n-type layer provided on a semi-insulating substrate of gallium arsenide, this layer carrying a Schottky contact and being adjacent to a first $n^{30}$-type layer. The transistor monolithically integrated with this diode comprises a Schottky gate contact formed at the surface of a second n-type layer adjoining on the one hand the first $n^{30}$-type layer and on the other hand a second $n^{30}$-type layer carrying the ohmic drain contact.

When manufactured in this manner, this structure would have to form the combination of a Schottky gate field effect transistor and diode serving as a capacitance, whose electrode is common to the source of the transistor. It should be noted that the contact common to the source and the cathode is not obtained by forming an ohmic layer at the surface of the first n-type layer.

In order to avoid switching noise being generated in the integrated circuits, it is absolutely necessary to provide a decoupling capacitance between the d.c. supply of these circuits and a reference electrode such as ground. If the integrated circuit has slow transitions (<50 ps), this capacitance can be arranged externally to the circuit and be connected to the d.c. supply and to ground through thin wires. However, if the integrated circuit has rapid transitions (>50 ps), the impedance of the flexible connection wires, which is then very high, has an unfavorable influence on the efficiency of the decoupling by an external capacitance thus connected.

Therefore, especially for the use aimed at in integrated circuits on semiconductors of the III-V group, which permit extremely rapid transitions, the decoupling capacitance of the d.c. supply has to be integrated with the microcircuit in order to avoid the use of the flexible connection wires.

SUMMARY OF THE INVENTION

The invention therefore has for its object to provide a solution of this problem. According to the invention, this solution is provided by a semiconductor device as described above, which is characterized in that it has at least one d.c. supply conductor and at least one ground conductor also integrated on the substrate, in that the d.c. supply conductor is connected resistively to the second semiconductor layer and in that the ground conductor forms a Schottky contact of large surface areas with the second semiconductor layer, thus constituting a diode polarized in the opposite sense and having a capacitance of high value.

According to the invention, the decoupling for avoiding switching noise is thus realized without elements arranged externally of the circuit, and without the surface of the latter being increased, while a very high speed of operation or a high-frequency operation can be obtained with a device of a very simple construction.

BRIEF DESCRIPTION OF THE DRAWING

In order that the invention may be readily carried out, it will now be described more fully, by way of example, with reference to the accompanying drawings, in which:

FIG. 1 shows the electric circuit diagram of a device according to the invention;

FIG. 2 shows in sectional view an application of the invention according to this electric circuit diagram;

FIG. 3 shows the electric circuit diagram of a particular device according to the invention;

FIG. 4 shows in sectional view of the application of the invention according to this particular electric circuit diagram.

DESCRIPTION OF THE PREFERRED EMBODIMENTS

As shown diagrammatically in FIG. 1, the device according to the invention comprises a field effect transistor T, whose drain D is connected to the d.c. supply conductor $V_{DD}$ through a load R. This transistor has a gate G and a source S which may be connected, for example, to ground M.

The d.c. supply $V_{DD}$ is decoupled with respect to ground M by a diode $\Delta$, whose cathode K is connected to the supply $V_{DD}$, while the other electrode, i.e. the anode A, is connected to ground.

The gate G of the field effect transistor T may receive, for example, an input signal I and the output signal U of the device is available at the drain D.

This device can be monolithically integrated on a semiconductor wafer as shown in FIG. 2. In an embodiment, of the semiconductor material may be gallium arsenide, i.e. a material of the III-V group, whose properties permit obtaining high-speed devices or devices operating at high frequencies.

As shown in FIG. 2, the device according to the invention comprises a semi-insulating substrate 10 of a material of the III-V group, at whose surface are formed a first n-type layer 111 and a second n-type layer 112, these layers having a lattice parameter compatible with the substrate. These layers are limited on the one hand and are separated from each other on the other hand by semi-insulating zones 12.

The field effect transistor T is constituted by the first n-type layer 111, by the he source S, by the ohmic contact 22 forming the drain D and by the Schottky contact 23 forming the gate G, which may be realized in a zone 25 of reduced thickness of the layer 111 forming in this case a field effect transistor having a so-called groove channel.

The source S and the drain D can be thickened by metal layers 53 and 52, respectively, which are designated as second interconnection layers, which connect the source S, for example, to ground M and the drain D to the load R (not shown here), respectively, FIG. 2 corresponding to the part F$_2$ of FIG. 1 limited by a broken line.

The diode Δ is constituted by the second n-type layer 112, by the ohmic contact 2 forming the cathode K and the Schottky contact 3 forming the anode A. For example, a d.c. supply conductor V$_{DD}$ is formed on the semi-insulating zone 12, which separates the n-type layers 111 and 112 from each other. The cathode K of the diode is then connected to this conductor by a metal layer 51 forming a second interconnection layer.

As far as the anode A is concerned, the latter is provided so as to coincide with a ground conductor of large surface area. When thus formed, the diode Δ is polarized during the operation of the microcircuit in the opposite sense. It constitutes a capacitance having a value:

$$C = \epsilon \frac{S}{W},$$

where
ε is the permittivity,
W is the thickness of the depletion zone under the Schottky contact 3 forming the anode A, and
S is the surface area of this Schottky contact.

The d.c. supply voltage V$_{DD}$ is chosen to be lower than the depletion voltage of the n-type layer 112, which can be readily realized without diminishing the performance of the transistor T in that it is ensured that the gate contact of the latter is provided in the zone 25 of reduced thickness of the n-type layer 111, as stated above.

In these conditions, since the ground conductor has a large surface area S, which is otherwise favorable for the circuit, the capacitance C thus obtained has a high value.

In the embodiment in which the material forming the substrate and the n-type layers is gallium arsenide (GaAs), the d.c. supply voltage V$_{DD}$ is of the order of 1.2V, while the capacitance is of the order of $10^{-15}F/\mu m^2$.

For a ground conductor having a surface area:

$$S \simeq 10,000/\mu m^2,$$

then $$C \simeq 10\, pF = 10^{-11} F,$$

the impedance $$Z = 1/c\omega$$

where $w$ is $2\pi f$, being the operating frequency which can reach a value of 10 GHz corresponding to transitions of the order of 50 ps.

$$f = 10 \cdot 10^{-9} Hz.$$

Then $Z = \dfrac{1}{10^{-11} \cdot 2\pi \cdot 10 \cdot 10^9} = \dfrac{10}{2\pi} \simeq 1.5\Omega.$ Such a result is very advantageous when it is compared with the results which would be obtained if the decoupling should be realized by a capacitance arranged externally of the circuit and connected to the d.c. supply and to ground through thin wires. In the case of rapid transitions of the order of 50 ps, the self-inductance L of the thin connection wires is of the order of 1 nH per mm. For a corresponding frequency of 10 GHz, the impedance is then Z' such that:

$$L = 10^{-9} H \qquad f = 10 \cdot 10^{-9} Hz$$
$$Z' = L$$
$$Z' = 1 \cdot 10^{-9} \cdot 2\pi \cdot 10 \cdot 10^9 \simeq 60\Omega.$$

It should therefore be noted that the impedance Z ≃ 1.5Ω obtained in the case of the invention is very small with respect to the impedance Z' ≃ 60 Ω obtained for the connection wires in the case of the use of an external capacitance. This calculation shows clearly that it is not possible to use an external capacitance at frequencies higher than or equal to 10 GHz.

On the contrary, the capacitance formed in accordance with the invention is very effective.

In another embodiment shown diagrammatically in FIG. 3, the load R of the transistor T is of the resistive type. An advantageous application of the invention is then shown in sectional view in FIG. 4 corresponding to the assembly of the circuit F$_4$ limited by a broken line in FIG. 3.

As shown in this FIG. 4, the device comprises a single N-type layer 11 formed at the surface of the semi-insulating substrate 10 and limited by the semi-insulating zones 12. The transistor T, the resistor R and the diode Δ are formed in the same n-type layer 11.

The transistor T comprises, as in the preceding embodiment shown in FIG. 2, an ohmic contact 21 forming the source S connected through a metallization 53 forming a second interconnection layer to a reference potential, i.e. to ground M, a Schottky contact 23 forming the gate G that may be provided in a zone 25 of reduced thickness of the N-type layer and an ohmic contact 22 forming the drain D covered, for example, by a metallization 521 forming a second interconnection layer. The gate G can then receive an input signal I, an output signal U being available at the drain.

The resistor R is formed between the ohmic drain contact 22 and a second ohmic contact 2, which additionally constitutes the cathode K of the diode Δ. The contact 2 is covered by a second interconnection layer 51, which permits connecting it to the d.c. supply V$_{DD}$. The diode Δ finally comprises, as before, a Schottky contact 3 constituting both the anode A and the ground conductor M of large surface area.

The operation and the performances of the circuit are identical to those of the preceding embodiment shown in FIG. 2. Moreover, the device according to the invention shown in FIG. 4 is of a particularly simple and advantageous construction.

In the case in which the semiconductor device is made of gallium arsenide (GaAs), the ohmic contacts can be formed from a gold-germanium (Au-Ge=40/60) alloy and the Schottky contacts as well as the metallization forming second interconnection layers or the supply conductor V$_{DD}$ on the semi-insulating zone may be constituted by superimposed layers of titanium-platinum-gold (Ti-Pt-Au) or of titanium-platinum-nickel (Ti-Pt-Ni). The n-type layer(s) and the semi-insulating zones may be obtained by numerous methods, such as epitaxial growth in conjunction with, for example, implantation or solely ion implantation, each of these methods being known to those skilled in the art and, structly speaking, not being essential to the invention.

Therefore, it is clear that numerous variations are possible without departing from the scope of the invention as defined by the following appended claims.

What is claimed is:

1. A semiconductor device comprising:
    a substrate having a major surface, a diode and at least one field effect transistor integrated monolithically on said substrate with said diode;
    said transistor being formed by a first n-type semiconductor layer on said major surface of said substrate, said transistor having ohmic source and drain contacts on said first semiconductor layer and a gate electrode located between said source and drain contacts and forming a rectifying junction with said first semiconductor layer;
    said diode being formed by a second n-type semiconductor layer on the surface of said substrate, said diode having a Schottky anode contact of large surface areas provided on said second semiconductor layer said anode contact comprising a d.c. ground conductor for said device, said diode further having an ohmic cathode contact on said second semiconductor layer which is directly connected to a d.c. supply conductor formed on the surface of said substrate; and
    means for forming a high-capacity decoupling capacitor which decouples said d.c. supply conductor from said ground conductor during operation of said device and which includes means for polarizing said diode in the nonconductive sense during operation.

2. A semiconductor device as claimed in claim 1, characterized in that the semiconductor layers comprise a material of the III-V group.

3. A semiconductor device as claimed in claim 2, characterized in that the semiconductor layers consist of gallium arsenide.

4. A semiconductor device as claimed in claim 2 or 3, further comprising a semi-insulating zone, characterized in that the first n-type layer and the second n-type layer are separated from each other by said semi-insulating zone.

5. A semi-conductor device as claimed in claim 2 or 3, characterized in that the first n-type layer and the second n-type layer form part of the same coherent semiconductor layer.

6. A semiconductor device as claimed in claim 1, 2 or 3, characterized in that the field effect transistor has a resistive load, which is formed in prolonged part of the first n-type layer, and in that the resistive load comprises end contacts which are on the one hand the ohmic drain contact of the transistor and on the other hand a second ohmic contact also provided to said first n-type layer at a surface portion thereof and connected to the supply conductor.

7. A semiconductor device as claimed in claim 6, characterized in that the d.c. supply conductor comprises a metal layer at a surface portion of the semi-insulating zone, said metal layer being connected to the second semiconductor layer and to the second ohmic contact of the resistive load through a second interconnection layer comprising a superimposed metal layer.

8. A semiconductor device as claimed in claim 1, 2 or 3, characterized in that the gate electrode forms a Schottky contact with the first semiconductor layer.

9. A semiconductor device as claimed in claim 8, characterized in that the field effect transistor is of the type having a grooved channel.

10. A semiconductor device as claimed in claim 1, 2 or 3, characterized in that the substrate consists of semi-insulating gallium arsenide.

* * * * *